United States Patent
Mannhart

(10) Patent No.: US 11,342,645 B2
(45) Date of Patent: May 24, 2022

(54) NON-RECIPROCAL FILTERS FOR MATTER WAVES

(71) Applicant: Max-Planck-Gesellschaft Zur Förderung Der Wissenschaften e.V., Munich (DE)

(72) Inventor: Jochen Mannhart, Böblingen (DE)

(73) Assignee: Max-Planck-Gesellschaft Zur Förderung Der Wissenschaften E.V., Munich (DE)

(*) Notice: Subject to any disclaimer, the term of this patent is extended or adjusted under 35 U.S.C. 154(b) by 0 days.

(21) Appl. No.: 16/976,848

(22) PCT Filed: Feb. 4, 2019

(86) PCT No.: PCT/EP2019/052634
§ 371 (c)(1),
(2) Date: Aug. 31, 2020

(87) PCT Pub. No.: WO2019/166187
PCT Pub. Date: Sep. 6, 2019

(65) Prior Publication Data
US 2020/0411938 A1    Dec. 31, 2020

(30) Foreign Application Priority Data
Mar. 2, 2018 (EP) .................... 18159767

(51) Int. Cl.
*H01P 1/32* (2006.01)
*H01P 1/36* (2006.01)

(52) U.S. Cl.
CPC .   *H01P 1/36* (2013.01); *H01P 1/32* (2013.01)

(58) Field of Classification Search
CPC .... H01P 1/32; H01P 1/36; H01P 1/362; H01P 1/365; H01P 1/37; H01P 1/375;
(Continued)

(56) References Cited

U.S. PATENT DOCUMENTS
2017/0207294 A1    7/2017  Gilbert et al.

FOREIGN PATENT DOCUMENTS
JP    2014-142425 A    8/2014

OTHER PUBLICATIONS

International Search Report for International Application No. PCT/EP2019/052634, dated Jun. 27, 2019, 4 pages.
(Continued)

Primary Examiner — Stephen E. Jones
(74) Attorney, Agent, or Firm — TraskBritt

(57) ABSTRACT

A non-reciprocal quantum device that comprises a first terminal and a second terminal, a transmission structure connected between the first and second terminals and configured to transmit microscopic particles in at least a partially phase-coherent manner from the first terminal to the second terminal and possibly from the second terminal to the first terminal, wherein a time-reversal symmetry of the transmission of the particles is broken with respect to at least a portion of the transmission structure; wherein the time-reversal symmetry is broken in such a way that the transmission structure comprises a higher transmission probability for particles moving in a first direction from the first terminal to the second terminal than in a second direction from the second terminal to the first terminal.

17 Claims, 11 Drawing Sheets

(58) Field of Classification Search
CPC .. H01P 1/38; H01P 1/383; H01P 1/387; H01P 1/393; H01P 1/397; G06N 10/00; G06N 10/40; G06N 10/20
See application file for complete search history.

(56) References Cited

OTHER PUBLICATIONS

International Written Opinion for International Application No. PCT/EP2019/052634, dated Jun. 27, 2019, 5 pages.
Keller et al. "Magnetotransport in a chaotic scattering cavity with tunable electron density" Surface Science 305 (1994) 501-506.
Li et al. "One-way transmission of electrons on the topological insulator surface modulated by magnetic potential" Journal of Applied Physics, American Institute of Physics, vol. 122, No. 21, (2017) XP012224291, ISSN: 0021-8979, DOI: 10.1063/1.5002728.
Bercioux et al. "Quantum transport in Rashba spin-orbit materials: A review" Reports on Progress in Physics 78 (Sep. 2015) 106001.
Brillouin "Can the Rectifier Become a Thermodynamical Demon?" Phys. Rev. 78, 627 (1950).
Japanese Notice of Reasons for Refusal for Japanese Application No. 2020-541903, dated Oct. 12, 2021, 9 pages with English translation.
Kuzmenko et al. "Large directional optical anisotropy in multiferroic ferroborate" Phys. Rev. B 92, 184409 (Nov. 2015).
Landauer et al. "Resistance of Small Metallic Loops" Phys. Rev. Lett. vol. 54, Issue 18, 2049 (May 1985).
Manchon et al. "New Perspectives for Rashba spin-orbit coupling" Nat. Mat. 14, 871-882 (Aug. 2015).
McFee "Self-Rectification in Diodes and the Second Law of Thermodynamics" Am. Journ. Phys. 39, 814 (Nov. 1971).
Pascazio All You Ever Wanted to Know About the Quantum Zeno Effect in 70 Minutes, Open Systems & Information Dynamics, vol. 21, Nos. 1&2 (2014) 1440007 (22 pages).
Quinn "Time Reversal Violation" Journ. Phys.: Conf. Ser. 171, 012001 (2009).
Rycerz et al. "Valley Filter and Valley Valve in Graphene" Nature Physics vol. 3, pp. 172-175 (Mar. 2007).
Signoles et al. "Confined quantum Zeno dynamics of a watched atomic arrow" Nat. Phys. 10, 715- (Aug. 2014).

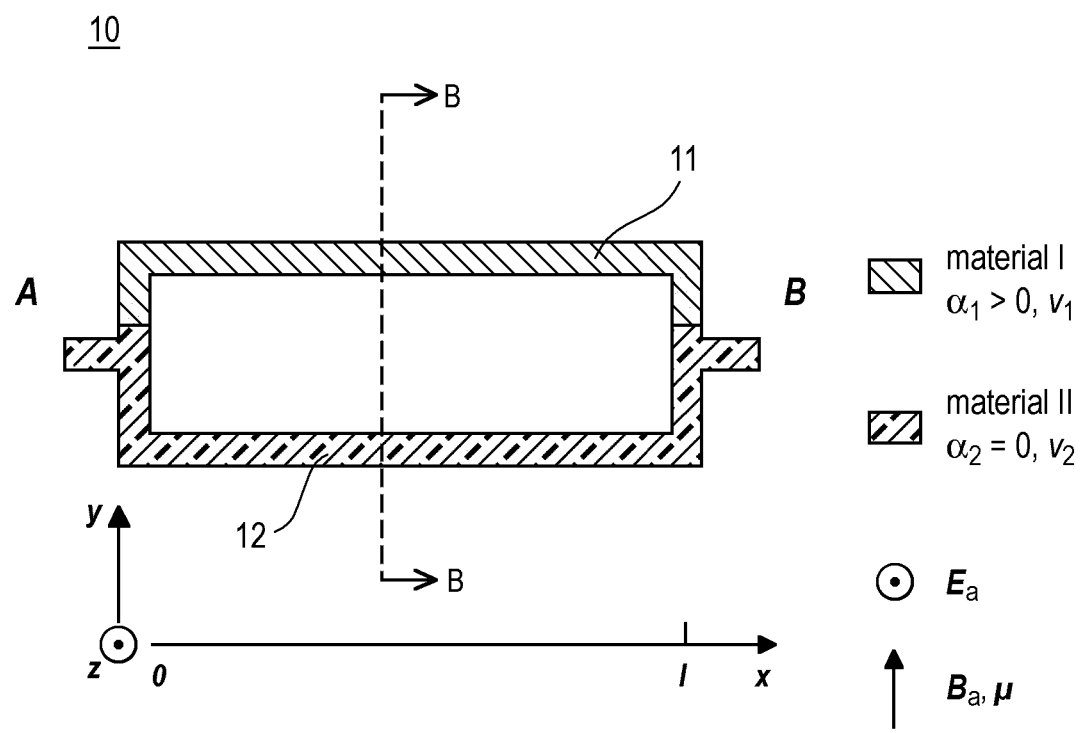
Fig. 1A
Fig. 1B

NON-RECIPROCAL FILTERS FOR MATTER WAVES

CROSS-REFERENCE TO RELATED APPLICATIONS

This application is a national phase entry under 35 U.S.C. § 371 of International Patent Application PCT/EP2019/052634, filed Feb. 4, 2019, designating the United States of America and published in English as International Patent Publication WO2019/166187 A1 on Sep. 6, 2019, which claims the benefit under Article 8 of the Patent Cooperation Treaty to European Patent Application Serial No. 18 159 767.5, filed Mar. 2, 2018.

TECHNICAL FIELD

This disclosure relates to a quantum device, an array of a plurality of interconnected quantum devices, and a use of the quantum device or the array of quantum devices for different applications. The disclosed quantum device comprises a transmission asymmetry, which essentially means that the flow of microscopic particles through a special kind of transmission structure is more probable to occur in a first direction than in a second opposite direction. This can basically be achieved by breaking the time invariance symmetry of the motion of the particles in a portion of the transmission structure and possibly also the spatial invariance symmetry. A possible implementation includes a structure comprising two conduction channels having different properties, e.g., either different spin-orbit couplings and different particle velocities or different vector potentials and different particle velocities. The quantum device or an array of interconnected quantum devices can be used for signal and data processing applications, generating electric power, or filtering particles e.g., according to their velocities or motion directions.

BACKGROUND

For illustrating background art reference is made to the following prior art:

[1] L. Brillouin, Phys. Rev. 78, 627 (1950).
[2] R. McFee, Am. Journ. Phys. 39, 814 (1971) and references therein.
[3] A. Manchon et al., Nat. Mat. 14, 871 (2015).
[4] D. Bercioux and P. Lucignano, Rep. Prog. Phys. 78(2015) 106001.
[5] L. D. Landau and E. M. Lifshitz, chap. XVII in "Quantum Mechanics: Non-Relativistic Theory," vol. 3 of "Course of Theoretical Physics" (2nd ed.), Pergamon Press.
[6] H. R. Quinn, Journ. Phys.: Conf. Ser. 171, 012001 (2009).
[7] S. Pascazio, Open Syst. Inf. Dyn. 21, 1440007 (2014).
[8] A. Signoles, A. Facon, D. Grosso, I. Dotsenko, S. Haroche, J.-M. Raimond, M. Brune and S. Gleyzes, Nat. Phys. 10, 715 (2014).
[9] A. Rycerz, J. Tworzydlo, and C. W. J. Beenakker, Nature Physics volume 3, pages 172-175 (2007).
[10] A. M. Kuzmenko, V. Dziom, A. Shuarev, Anna Pimenov, M. Schiebl, A. A. Mukhin, V. Yu. Ivanov, I. A. Gudim, L. N. Bezmaternykh, and A. Pimenov, Phys. Rev. B 92, 184409 (2015).
[11] R. Landauer and M. Büttiker, Phys. Rev. Lett. Vol. 54, No. 18, 2049.

There has long been an effort among scientists and developers to build systems or devices of various kinds that enable state changes in a desired direction in a self-acting manner and thus, for example, generate energy or allow a sorting of directions of components or particles. For example, the question of whether it is possible to design an electrical device that can automatically rectify thermal noise currents has been discussed for many years. Such an electrical device was, for example, proposed under the term "self-rectifying diode" and was essentially based on a semi-conductor pn-junction (see, e.g., [1, 2]). However, working devices have never been demonstrated.

This disclosure will provide a novel quantum device that presents an example for a device, which allows the above-mentioned self-acting or automatic state changes in a desired direction and will be shown to be a basis for a variety of possible applications.

BRIEF SUMMARY

In accordance with a first aspect of the disclosure, a quantum device comprises a first terminal and a second terminal, a transmission structure connected between the first and second terminals and configured to transmit microscopic particles in an at least partially phase-coherent manner from the first terminal to the second terminal and possibly from the second terminal to the first terminal, wherein a time-reversal symmetry of the transmission of the particles is broken with respect to at least a portion of the transmission structure, wherein the time-reversal symmetry is broken in such a way that the transmission structure comprises a higher transmission probability for particles moving in a first direction from the first terminal to the second terminal than in a second direction from the second terminal to the first terminal.

In accordance with a second aspect of the disclosure, an array comprises a plurality of quantum devices according to the first aspect, wherein the quantum devices are connected to each other in series and/or in parallel.

In accordance with a third aspect of the disclosure, a use of the quantum device according to the first aspect or the array according to the second aspect comprises either one of generating electric power in the form of one or more of electric current or electric voltage, filtering particles according to their group velocity, or filtering particles according to their transmission directions.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

FIG. 1 comprises FIGS. 1A and 1B and shows a schematic top view representation (FIG. 1A) and a cross-sectional side view representation (FIG. 1B) of a quantum device according to an example of the first aspect, which example is based on the Rashba effect and in which the first transmission path comprises a two dimensional electron gas in a quantum well structure.

DETAILED DESCRIPTION

Figure 2A:
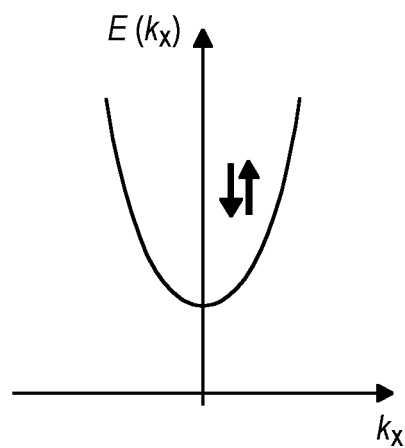
FIG. 2 comprises FIGS. 2A-2C and shows the energy dispersion relation of spin-polarized electrons in the first transmission path without external magnetic and electric fields (FIG. 2A), the same as (FIG. 2A) after applying an external magnetic field (FIG. 2B), and the same as (FIG. 2B) after applying an external electric field.

In the following description the terms "coupled" and "connected," along with derivatives may be used. It should be understood that these terms may be used to indicate that two elements co-operate or interact with each other regardless whether they are in direct physical or electrical contact, or they are not in direct or physical or electrical contact with each other, which means that there can be one or more intermediate elements between the two elements.

When describing and claiming a quantum device in the following, it should be noted that the term "quantum device" is to be understood in a broad and extensive manner. Concerning its function it basically acts as a non-reciprocal filter for matter waves, i.e., for particle waves or quasiparticle waves of any kind. Concerning its structure it can be understood as an artificial or man-made structure in which, for example, electrical wires or lines are fabricated by different technological methods. It can, however, also be understood as consisting of or comprising chemical components like, for example, molecules, molecule compounds, molecule rings like benzene rings, and so on. It furthermore can refer to solid compounds, e.g., with crystalline structures that exert the device function.

Further on the term "transmission path" can be, but does not have to be understood as a material body. In some devices a material body e.g., a piece of wire, may comprise one transmission path. In some other devices such a material body may comprise two transmission paths, namely two opposing directions of particles propagating through the material body. In some other devices the term is not to be understood as a tangible or material body that is fabricated from a specific material. It is rather to be understood as a virtual path of a particle in space, and may even be placed, e.g., in a gaseous atmosphere.

Further on, the term "phase coherent" does not imply that there is no inelastic, phase-breaking scattering taking place in the device. Indeed, as shown in [11], some inelastic scattering, for example, with phonons, and/or phase-breaking processes are compatible with phase coherency and may be beneficial or at least in some if not in all cases even be required for device operation. The term "phase coherent" should therefore be understood as including either the presence or absence of inelastic, phase-breaking scattering of the transmission of particles in the device.

It should further be emphasized that in several of the examples of quantum devices shown and described in the following, no external voltage or current is applied to the device, in particular, to the external terminals of the device. The device then rather functions itself, in particular, as a source of voltage, current, or order or in a loss-free and/or non-superconducting and/or non-Josephson conducting manner as a conductor for currents. More generally speaking, in this case there are no required external forces driving the particles into the devices besides a heat bath having a temperature T>0 K. It is, however, also possible to apply an external voltage or current to one of the devices. In the examples of quantum devices shown and described in the following, the particles are moving due to their thermal excitation. Furthermore, the examples of quantum devices shown and described in the following, are not based on topological isolators and/or topological isolators are not involved in the functionality of the quantum devices.

In the following, a general principle of this disclosure, will be explained with the help of FIG. 1A.

FIG. 1A shows a top view onto a quantum device 10 that comprises a first terminal A and a second terminal B and a transmission structure connected between the first and second terminals. The transmission structure comprises two transmission paths 11 and 12, each one of which is configured to transmit microscopic particles like, for example, electrons in at least partially phase-coherent manner from the first terminal to the second terminal and possibly from the second terminal to the first terminal. A time-reversal symmetry of the transmission of the particles is broken with respect to a portion of the transmission structure, in particular, with respect to at least one of the transmission paths, wherein the time-reversal symmetry is broken in such a way that the transmission structure comprises a higher transmission probability for particles moving in a first direction from the first terminal to the second terminal than in a second direction from the second terminal to the first terminal.

According to one example, which is probably the most interesting one concerning possible applications, the microscopic particles are electrons. In this case the first and second terminals, i.e., the contact leads, are made of electrically conducting materials like, for example, metals or metal alloys, or (highly) doped semiconductors. The two contact leads can be made of identical materials. Thermal electrons at or in the vicinity of the Fermi energy will enter the transmission paths from both of the terminals A and B.

The transmission structure may also comprise more than two transmission paths connected between the first and second terminals.

The first and second transmission paths 11 and 12 are shown to have equal structures and equal lengths. It is also possible to construct the device with different structures and lengths of the transmission paths.

In order to achieve the above indicated transmission asymmetry, it is essential to understand that the microscopic particle is associated with a particle wave and each time when a particle wave emanates from one of the first and second terminals it will be split up into partial waves propagating on the first and second transmission paths in the first and second directions, respectively. First partial waves propagate on both transmission paths in the first direction from A to B and converge and interfere with each other at the second terminal B and second partial waves propagate on both transmission paths in the second direction from B to A and converge and interfere with each other at the first terminal A. The transmission asymmetry, or in case of electrons the conductance asymmetry, can be reached when the first partial waves interfere more constructively than the second partial waves. In an ideal case the first partial waves interfere fully constructively and the second partial waves eliminate each other, i.e., in case of two transmission paths the phase difference between the interfering first partial waves is an even number of $\pi$ and the phase difference between the interfering second partial waves is an odd number of $\pi$.

The basis for the above and also for the other devices described here is the break of a time-reversal symmetry of the transmission of the particles with respect to a portion of the transmission structure. More specifically, considering the example of a quantum device as depicted in FIG. 1A, the transmission structure comprises a first transmission path 11 connected between the first and second terminals and a second transmission path 12 connected between the first and second terminals, and the time-reversal symmetry of the transmission of the particles is broken in the first transmission path 11. This will be outlined in detail further below.

The electrons each comprise a spin associated with a magnetic moment. The breaking of the time-reversal symmetry can basically be achieved by inducing spin polarization of the electrons, i.e., partly or fully aligning the magnetic moments of the electrons along one direction in the first transmission path, and applying an electric field that comprises a component oriented perpendicular to the direction of the magnetic moments and perpendicular to the direction of transmission of electrons in the first transmission path. The partial or complete spin polarization can be induced by an external magnetic field or, alternatively, can be provided by using a material that comprises by nature partly or fully polarized electron spins (e.g., especially half-metals or semi-metals). Time reversal symmetry breaking may, however, be also achieved by other means. Electron states occupying the two valleys in 2D conductors such as graphene is, for example, are related by time-reversal symmetry breaking (see [9]).

The first transmission path 11 may comprise a first material I, the first material comprising a first spin-orbit coupling strength $\alpha_1$ and a first electron group velocity $v_1$, and the second transmission path 12 may comprise a second material II, the second material comprising a second spin-orbit coupling strength $\alpha_2$ different from the first spin-orbit coupling strength $\alpha_1$ and a second electron group velocity $v_2$ different from the first electron group velocity $v_1$.

In the following it is assumed that the configuration, as described above, gives rise to the well-known Rashba effect (see [3], [4]), which means that the parameters $\alpha_1$ and $\alpha_2$ are given by Rashba spin-orbit coupling strengths. In the following we assume that $\alpha_1=\alpha>0$ and $\alpha_2=0$. In the simplest case, the second material II of the second transmission path 12 can be a metal like, for example, Au, In, Al, or Cu.

The Rashba Hamiltonian of an electron is given by $$H=\hbar^2 k^2/2m+\alpha(\sigma \times k)\cdot \hat{z}-\mu B_a \qquad (1).$$

Here, k describes the wave number of the electron with canonical momentum $p=\hbar k$, m the electron mass, $\sigma$ the vector of the Pauli matrices, z the unit vector of the direction in which the electric field is applied, $\mu$ the electrons magnetic moment, $B_a$ the applied magnetic field, and $$\alpha = \frac{\mu E_Z}{2mc^2}. \qquad (2)$$

In Eq. (2), $E_z$ is the z-component of the electric field E and c the speed of light.

Figure 2B:
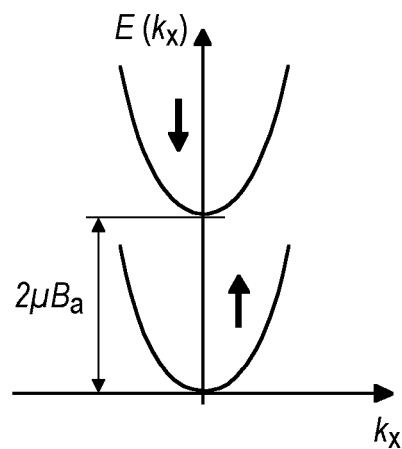

To explain the device function, consider the case that E=0, that $B_a$ points in y-direction (see FIG. 2A), that the electrons move in x-direction in an xy-oriented, two-dimensional quantum well of length l, and that their motion is characterized by a parabolic dispersion $E=p^2/2m=\hbar^2 k^2/2m$. The applied magnetic field $B_a$ is taken to be so large that the Zeeman energy $E=-\mu B_a$ is by far the dominating energy term, yielding virtually complete spin polarization. In this case the dispersion parabola is split according to the direction of the electron spin as illustrated in FIG. 2B.

It should be mentioned at this point that complete spin polarization is not necessary. It would even be sufficient to have only a spin polarization ratio of 51% to 49% (spin-up, spin-down) to yield a net transmission direction of the particles and thus to make the device work.

According to Eq. (1), for E>0 the two parabola are shifted by $k_R=\alpha m/\hbar$ in opposite directions along the k-axis (see FIG. 2C). Because of the large Zeeman energy, we consider only electrons with spins pointing in the y-direction that occupy the dispersion parabola with the lower energy. A corresponding scenario may also be implemented by using a half-metal or semi-metal as already indicated above. Because the occupancy of the parabola with the high-energy spin direction decreases exponentially for large values of $B_a$, we discard this parabola also for the case of E>0.

It is pointed out that while also with the Rashba coupling the particle energy is symmetric in v: $E=\frac{1}{2}mv^2$, the particle's canonical momentum and wave number are not: $p=\hbar k_x=m(v+\alpha)$. Electrons travelling with the same absolute velocity in opposite directions $v_1=-v_2$ are characterized by wave numbers of different absolute values:

$$\hbar k_1 = m(v_1+\alpha) \quad (3)$$

and $$\hbar k_2 = m(v_2+\alpha) = m(-v_1+\alpha) \quad (4)$$

Figure 2C:
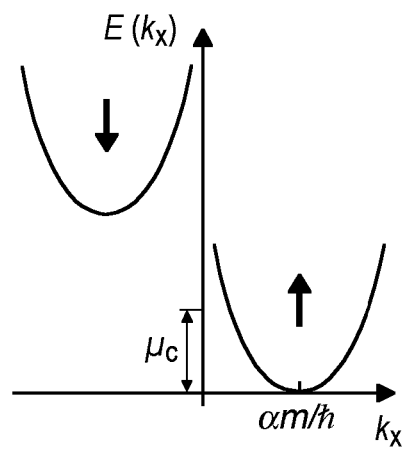
Figure 3A:
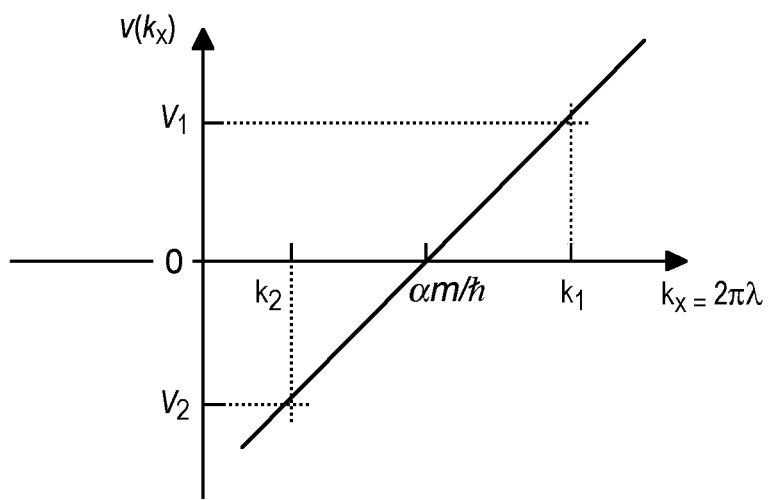
FIG. 3 comprises FIGS. 3A and 3B and shows the v(k) relation for one spin component (FIG. 3A), and the energy dispersion relation for the one spin component and the velocities $v_1$ and $v_2$ at the dispersion curve.
Figure 3B:
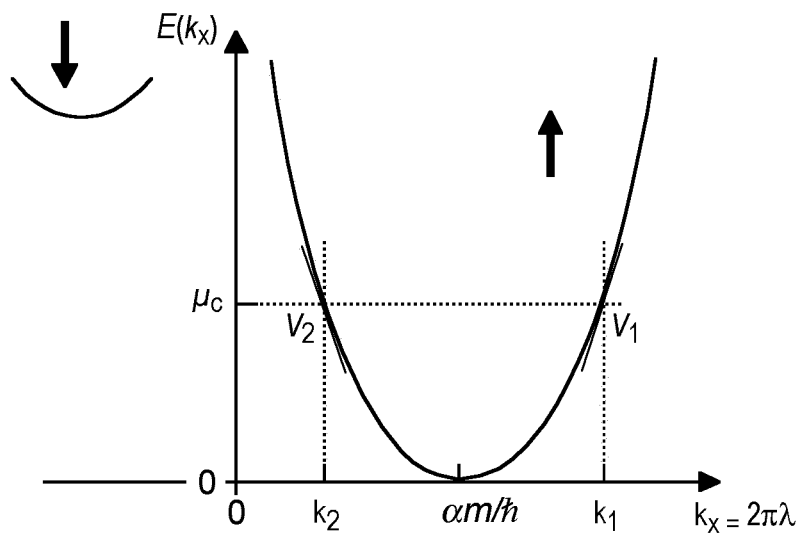

(see FIG. 2C for illustration). Note the peculiar cases of $k=m\alpha/\hbar$ for $v=0$ and $k=0$ for $v=-\alpha$.

To assess possible phase changes related to the energy of the particle, we consider the planar wave function corresponding to Eq. (1) (neglecting for clarity the Zeeman field):

$$\Psi(x) = \Psi_0 e^{i/\hbar[m(v+\alpha)x - E_{tot}t]} = \Psi_0 e^{i[k_x x - \omega t]} \quad (5)$$

Here, $E_{tot}$ is the total energy of the particle, and t is the time. The term $E_{tot}t$ does not affect the aforementioned asymmetry, because owing to $|v_1|=|v_2|$ the energy $E_{tot}=\frac{1}{2}mv^2$ as well as the particle's duration of travel are independent of the travel direction for a given spin polarity.

With the assumption that the electron's phase changes can be described in analogy to the phase changes of wave packets in conventional materials, Eq. (3) and (4) yield the phase change of an electron starting at A(x=0) and travelling on first transmission path 11 (path I) to arrive at B(x=l):

$$\Delta\varphi_{AB,I} = m(v_1+\alpha)x|_0^l = m(v_1+\alpha)l \quad (6).$$

An electron starting at B and travelling to A on first transmission path 11 changes its phase by:

$$\Delta\varphi_{BA,I} = m(v_2+\alpha)x|_l^0 = m(-v_1+\alpha)x|_l^0 = m(v_1-\alpha)l \quad (7).$$

We now consider the wave function moving on the second transmission path 12 (path II). The device is designed such that the Rashba effect vanishes on the second transmission path 12, for example, by setting E=0 on this branch. Then:

$$\Delta\varphi_{AB,II} = mv_{II}l \quad (8)$$

and $$\Delta\varphi_{BA,II} = mv_{II}l \quad (9)$$

The length l of the device is chosen such that the electron travelling on the two paths from A to B constructively interferes with itself at B:

$$\Delta\varphi_{AB,I} = \Delta\varphi_{AB,II} + 2\pi n \quad (10)$$

n being an integer. This is achieved for $$l' = 2\pi n/m(\Delta v+\alpha), \text{ with } \Delta v := v_1 - v_2 \quad (11)$$

In a device with l=l', the two parts of the waves of an electron travelling from B to A arrive at A with a phase difference $$\Delta\varphi_{BA,I} - \Delta\phi_{BA,II} = \frac{\Delta v - \alpha}{\Delta v + \alpha} 2\pi n. \quad (12)$$

Figure 4A:
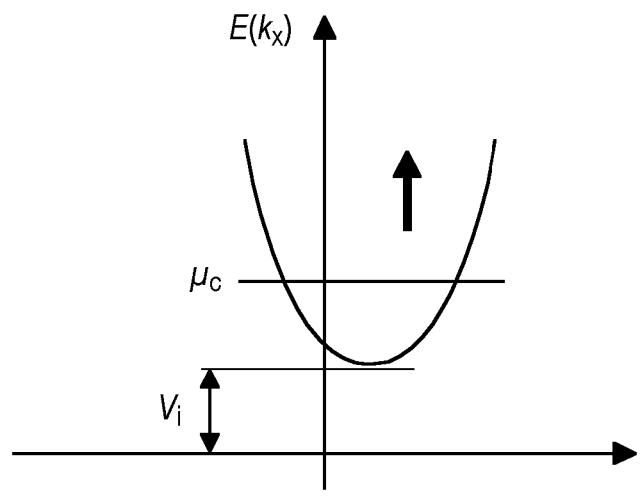
FIG. 4 comprises FIGS. 4A and 4B and shows the energy dispersion relation for the first material (I) in the first transmission path (FIG. 4A) and the energy dispersion relation for the second material (II) in the second transmission path (FIG. 4B).
Figure 4B:
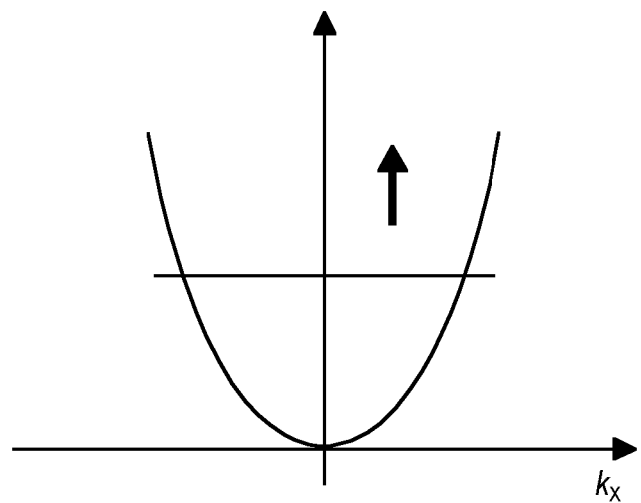

Provided that $\Delta v \neq 0$, $\Delta\varphi_{BA,I} - \Delta\varphi_{BA,II} \neq 2\pi n$, except under special conditions, such as $\Delta v \neq \alpha$. The condition $\Delta v \neq 0$ can be fulfilled by choosing two different materials with appropriate band structures for the first and second transmission paths, as illustrated in FIG. 4.

As a result, for l=l', $\Delta v=\alpha$ and $\Delta v \neq 0$, the transparency of the quantum device, or in case of electrons the conductance, depends on the direction of the incoming particle because the electrons originally travelling from B to A are reflected from terminal B back into the device, where they may undergo scattering and/or leave the device via terminal A.

It should be mentioned that the lengths l of the first and second transmission paths have to be chosen such that at least partial phase-coherent particle transmission is ensured. In practice this means that the length l should not be much greater than the typical inelastic scattering length of electrons in the particular material, with typical scattering lengths being of the order of 100 nm.

It may well be possible to replace the Rashba coupling by other forms of spin-orbit coupling or even to break the time-reversal symmetry by other means than by spin-orbit coupling. An example of such a means is given by electrons states occupying the two valleys in 2D conductors such as graphene that, for example, are related by time-reversal symmetry breaking (see [9]). Further means can easily be found by the skilled person in relevant text books dealing with the breaking of time and space invariance symmetries.

The electric field can be generated in the first material of the first transmission path, e.g., by ions or defects that can be appropriately embedded into the material or that can be present by nature.

It should further be mentioned that it is not necessary to have two spatially distinct transmission paths. It is also possible to provide an integral or one-piece material body. Such a material body may comprise two material regions being integral regions with each other. Moreover, the two materials can even be identical as it is only necessary to activate the Rashba effect in the first transmission path, i.e., to apply the electric field only at the first transmission path and not at the second transmission path.

As was also mentioned above, this disclosure, in principle, also works with particles other than electrons including neutral particles like, for example, neutrons. If based on the Rashba effect, the particles, however, have to carry a magnetic moment.

It should further be mentioned that the area of the loop or ring hole is not relevant for the functioning of the device and may vanish. Important is the existence of several paths for the particles to travel on.

Artifacts resulting from the Hall effect of electrons moving in the magnetic field $B_a$ can be avoided by using two-dimensional electron systems residing, for example, in quantum wells as channels. Such an example is shown in FIG. 1B, which shows a cross-sectional view through the first and second transmission paths. As can be seen, the first transmission path comprises a conventional quantum well layer stack of AlGaAs/GaAs/AlGaAs wherein the two-dimensional electron system is present in the GaAs layer. It should be mentioned here that the Rashba effect only works in materials lacking an inversion center, so that in case of a quantum well the potential enclosing the GaAs quantum well need to be asymmetric requiring different AlGaAs materials on either sides of the quantum well. The electric field could be generated by ions or crystal defects incorporated in one of the AlGaAs layers.

Of course the first material of the first transmission path could also be comprised of a bulk material instead of a quantum well.

It should further be mentioned that it is also possible to operate different quantum devices in parallel. A first quantum device, for example, would be configured to transmit slow particles with velocity $v_1$ from A to B, and a second quantum device connected in parallel with the first quantum device would be configured to transmit fast particles with velocity $v_2$ from B to A, wherein $v_2 > v_1$.

The performance of the quantum devices may be enhanced by ensuring that the electrons coming from the contacts arrive with the velocities that are optimal for device performance. This may be achieved, for example, by using contact materials with a suitable band structure, such that the band structure provides a large number of electrons with the desired velocities. Furthermore, the asymmetric conductors may be operated in series with velocity filters.

The first material of the first transmission path may also be configured such that the Rashba coefficient α may vary smoothly across the device. It is also possible that the first material may cover less than one arm.

The interfaces between the materials need to allow for elastic electron transport. Ideally, the materials' band structures (dispersion relations) should be appropriately matched. The interfaces do not need to be abrupt. Alternatively, tunnel junctions may be embedded.

As was already mentioned above, it is possible that the second transmission path comprises an elementary or alloy metal. For ease of fabrication it can be identical with the material of the contact leads and also formed integral with the contact leads so that the device comprises two materials, namely the first material of the first transmission path and the second material of the second transmission path and the contact leads. It is however also possible that more than two materials may be used. The contact leads, e.g., may be formed by a third material.

Figure 5:
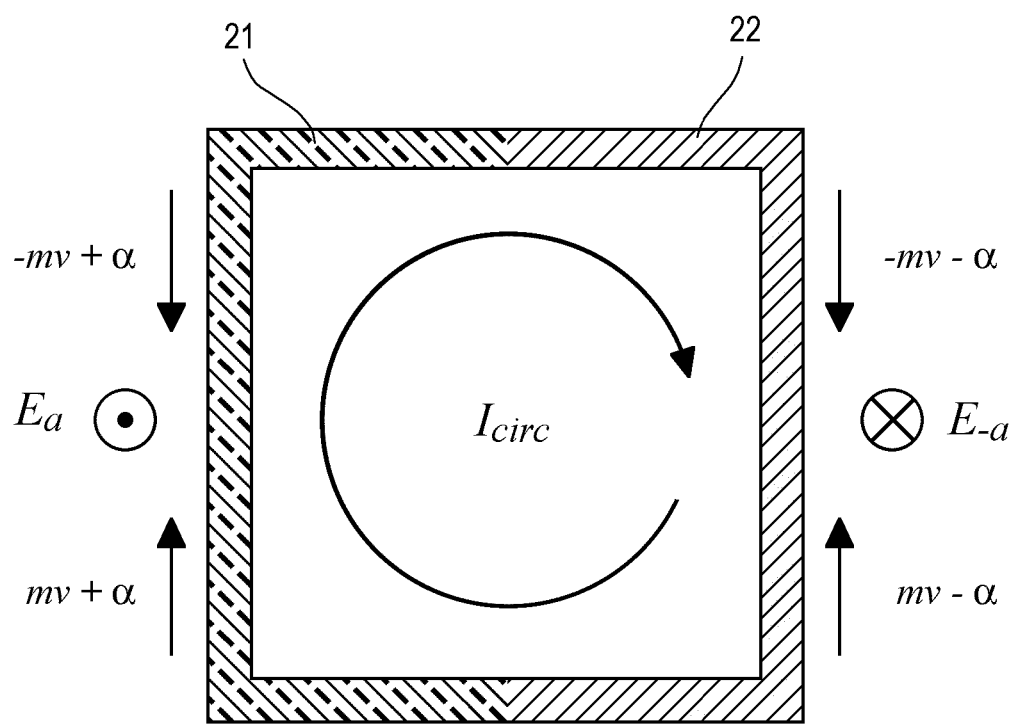
FIG. 5 shows a schematic top view representation of a quantum device according to an example that comprises two transmission paths, each of which comprises a (Rashba) spin-orbit coupling.

FIG. 5 shows a further example of a quantum device according to the first aspect. The quantum device 20 comprises a first transmission path 21 and a second transmission path 22. In the example of a quantum device as shown in FIG. 1, only the first transmission path 11 was subject to the Rashba effect, but not the second transmission path, which can be a pure electric conductor. In contrast thereto in the example of the quantum device 20 of FIG. 5 both first and second transmission paths 21 and 22 are subject to the Rashba effect but in an antiparallel manner. This can be achieved by applying two antiparallel electric field components, a first one $E_a$ acting on the first transmission path 21, and a second one $E_{-a}$ acting on the second transmission path 22 wherein both field components are oriented perpendicular to the plane of the transmission paths and antiparallel to each other. The absolute values of v and α may even be equal for the first and second transmission paths 21 and 22. The result is a circulating current $I_{circ}$ in the ground state of the device. The first and second terminals are not shown in FIG. 5.

Figure 6A:
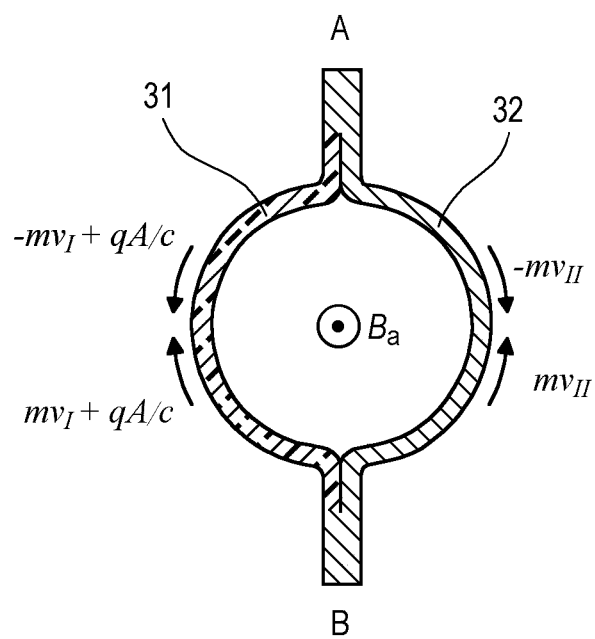
FIG. 6 comprises FIGS. 6A and 6B and shows a schematic top view representation of a quantum device according to an example that is based on a magnetic flux penetrating the ring structure and in which the first and second transmission paths are comprised of two different materials (FIG. 6A), and a schematic top view representation of a quantum device according to an example of the first aspect of the disclosure, which example is based on a magnetic flux penetrating the ring structure and an electric gate potential applied to one of the transmission paths and in which the first and second transmission paths are comprised of two identical materials (FIG. 6B).
Figure 6B:
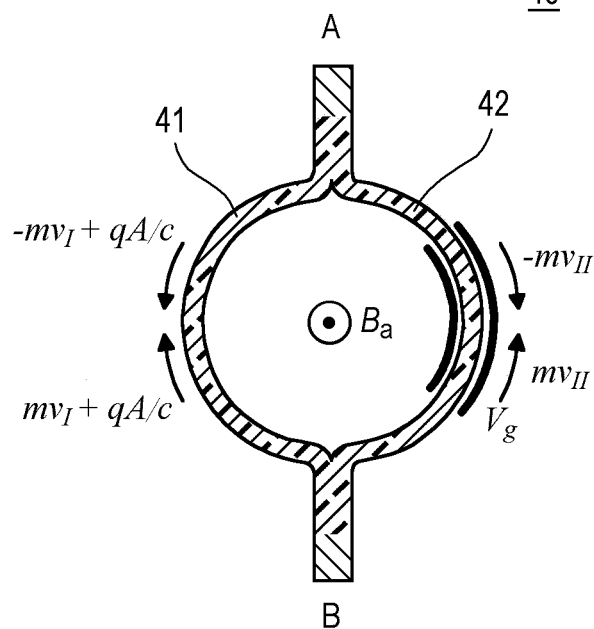

FIG. 6 comprises FIGS. 6A and 6B and show further examples of quantum devices according to the first aspect.

The quantum device 30 of FIG. 6A comprises a first transmission path 31 and a second transmission path 32. In contrast to the Rashba based devices of FIGS. 1 to 5 the quantum device 30 as shown in FIG. 6A does not need spin polarized particles nor any spin-orbit coupling like the Rashba effect. Instead, the quantum device 30 of FIG. 6A requires a magnetic field $B_a$ comprising at least a component perpendicular to the plane of the first and second transmission paths, and different velocities $v_I$ and $v_{II}$ of electrons in the first and second transmission paths. Moreover, the properties of the first and second transmission paths should be different in a way that the influence of a vector potential A of the magnetic field $B_a$ (B=rot A) should be different on the electron transmission in the first and second transmission paths. FIG. 6A shows a special case in which the materials are chosen such that the vector potential A only influences the electron movement in the first transmission path 31 and not in the second transmission path 32. The influence is such that in the first transmission path 31 a factor qA/c (q electron charge, c velocity of light) is added to the electron impulse in either directions. This factor is the analogue to the Rashba coefficient α in Rashba based devices. It should be added that like in the well-known Aharonov-Bohm effect the magnetic field $B_a$ can also be zero throughout the first transmission path 31. The electrons do only have to "see" the vector potential A.

The quantum device 40 of FIG. 6B comprises a first transmission path 41 and a second transmission path 42. In this example the materials of the first and second transmission paths are identical so that the vector potential A influences the electron movement in both transmission paths. However, an electric field $V_g$ is applied to a portion of the second transmission path 42, which electric field is adjusted to such a value that the influence of the vector potential A is compensated and at the same time the velocity is changed from $v_I$ to $v_{II}$ so that as a result the same configuration is provided as in the quantum device 30 of FIG. 6A concerning the electron impulses. The electric field can be generated by means of a capacitor comprising capacitor plates arranged on either sides of the second transmission path 42.

It should further be mentioned that a device like the one shown in FIG. 6B does not need to be implemented in solids so that also the transmission paths do not have to be materialized. The particles would instead propagate in free space, in particular, in a gaseous or even in a vacuum environment. Such a device would in fact consist only of the electric and magnetic fields. Such interferometers would, for example, also work for positrons.

Figure 7:
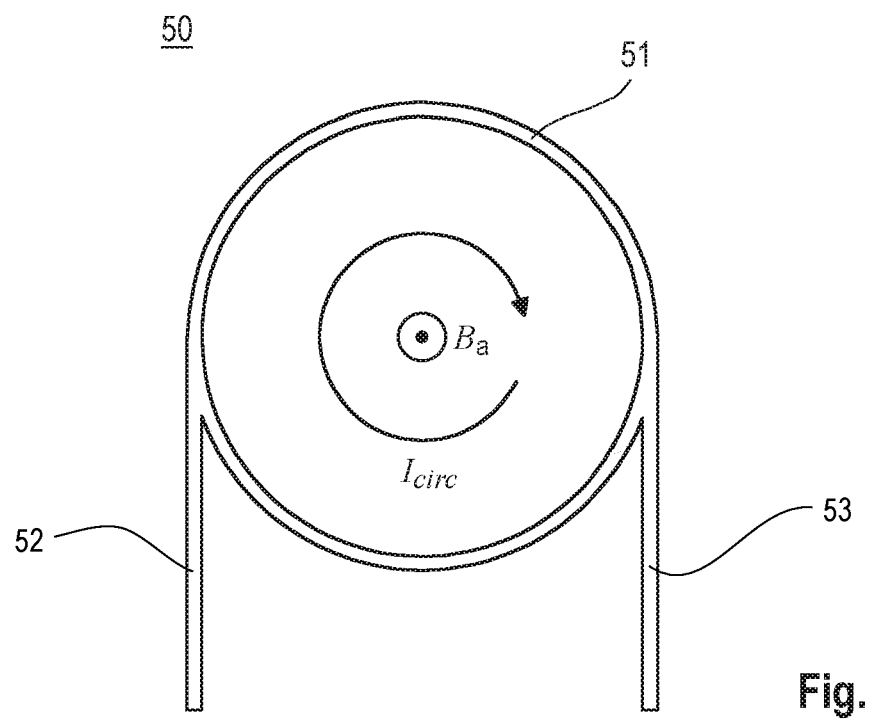
FIG. 7 shows a schematic top view representation of a quantum device according to an example in which a ring comprising a single material is penetrated by a magnetic field.

FIG. 7 shows a further example of a quantum device according to the first aspect. The quantum device 50 as shown in FIG. 7 comprises a ring 51 that is made of an electrically conducting material. The ring 51 is penetrated by a magnetic field $B_a$ such that a circulating current $I_{circ}$ is flowing in the ring 51. The magnetic field $B_a$ is or comprises a component oriented perpendicular to the plane of the ring 51. The quantum device 50 further comprises two electrically conducting leads 52 and 53 connected to the ring 51 at opposing locations. The dependence of the electron energy in the ring 51 as a function of electron momentum is non-symmetric with respect to momentum reversal. The ring 51 therefore acts as a non-reciprocal device if the leads 52 and 53 are attached such that each lead probes preferentially one momentum direction.

Figure 8:
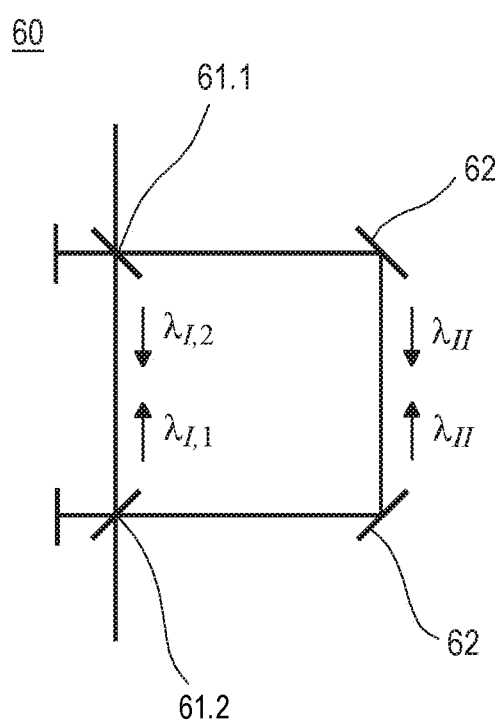
FIG. 8 shows a schematic top view representation of a quantum device according to an example in which the particles are photons and the device itself acts as a photonic interferometer.

FIG. 8 shows a further example of a quantum device according to the first aspect. The quantum device 60 as shown in FIG. 8 is a photonic interferometer, which is constructed according to the principle of the present disclosure. The quantum device 60 is based on a material that comprises an optical directional anisotropy, which means that, for example, the velocity of light in the material can be different for different directions of light propagation. Such a material can be, for example, a multiferroic material and the directional optical anisotropy in such a material is described, e.g., in [10]. The quantum device 60 comprises two beam splitters 61.1 and 61.2 through which light of wavelength $\lambda_{II}$ can enter the interferometer from two opposing sides. The quantum device 60 further comprises two mirrors 62 at which the light is reflected and fed back to the beam splitters 61.1 and 61.2, respectively (light portions that leave the interferometer through the beam splitters 61.1 and 61.2 are blocked). The beam paths can be in vacuum or in transparent material, with the exception of the beam path that is in direct line between the beam splitters 61.1 and 61.2. This beam path is in a material with optical directional anisotropy, which means that the light propagates with different velocities depending on the direction of the light beams wherein also the wavelengths of the light beams in the material change to $\lambda_{I,1}$ and $\lambda_{I,2}$ but their frequencies stay constant.

Actually the presence of this material breaks the time-invariance symmetry in this device. Light coming from below is split up by the beam splitter 61.2 in two beams, one of which passes through the material and the other one is reflected by the mirrors 62 and these two beams interfere at the beam splitter 61.1 and the same happens to light coming from above that is split up by the beam splitter 61.1 in two beams, which interfere at the beam splitter 61.2. The different velocities of the light beams passing each other in the material can be exploited by choosing the lengths of the light paths in such a way that, for example, light coming from one direction interferes more constructively at the respective beam splitter than light coming from the other direction. In an ideal case light coming from one direction interferes totally destructively and thus can be completely blocked and light coming from the other direction interferes totally constructively and passes through the interferometer only by suffering losses by light absorption in the material. Hence if the lengths of the beam paths are appropriately chosen, such an interferometer can work as a non-reciprocal valve for photons with an energy that is large compared to the temperature of the interferometer.

Figure 9:
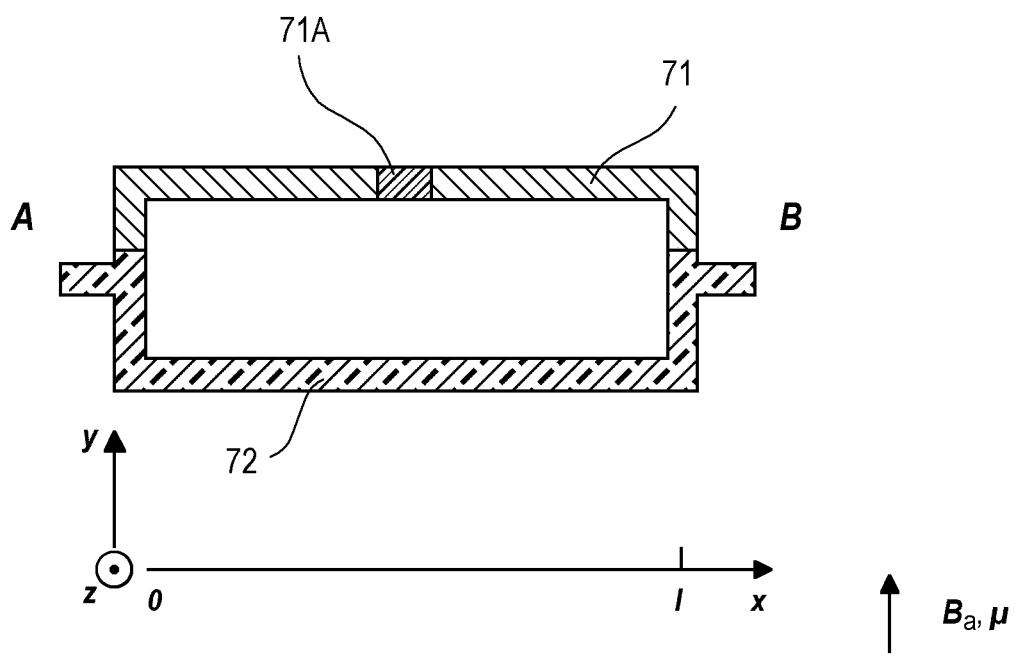
FIG. 9 shows a schematic top view representation of a quantum device according to an example of the first aspect in which example the first transmission path comprises a tunnel barrier with a spin-orbit coupling.

FIG. 9 shows a further example of a quantum device according to the first aspect. The quantum device 70 of FIG. 9 is similar to the quantum device 10 of FIG. 1 and comprises a first terminal A and a second terminal B and first and second transmission paths 71 and 72 connected between the first and second terminals, respectively. The quantum device 70 of FIG. 9 differs from the quantum device 10 of FIG. 1 essentially in the configuration of the first transmission path 71.

The first transmission path 71 contains a specially engineered tunnel junction or tunnel barrier 71A that breaks spatial-inversion (or left-right) symmetry through spin-orbit interaction. In addition, time-reversal symmetry is broken by an externally applied magnetic field $B_a$ (applied in y-direction). For simplicity, the tunnel barrier 71A is assumed to be fully elastic such that no energy is dissipated into the tunnel barrier 71A junction during the scattering. Under these circumstances, the scattering amplitudes f (p, s; p', s') for scattering across the barrier from state (p, s) (p is the momentum, s the spin) into state (p', s') do not necessarily fulfill the relation $$|f(p,s;p's')| = |f(-p',-s';-p,-s)| \quad (13)$$

Equation (13) follows from the reciprocity theorem for time-reversal invariant scattering potentials (see [5]). It is therefore suggested to search for scattering potentials for which the probability for an electron to traverse the barrier from left to right is different from the probability of the time-reversed process, i.e., $$\sum_{s,s'} |f(p, s; p, s')|^2 > \sum_{s,s'} |f(-p, s; -p, s')|^2. \quad (14)$$

Across such barriers electrons would be transmitted from the left to the right with higher probability than electrons approaching the barrier from the right, and therefore are candidates for systems that would transport matter in a preferred direction. This would also apply to thermally excited electrons.

A further possible quantum device could be constructed in such a way that the symmetry between the two paths would be broken by a gravitational potential $V_G(r)$. The gravitational potential would, for example, be configured so that it would change in y-direction along one of the transmission paths: $dV_G(r)/dy \neq 0$. Such a device would function like a directional membrane that sorts matter from antimatter.

The above description mainly dealt with the basic unit of this disclosure, i.e., a single ring or loop comprising two or more transmission paths connected between the first and second terminals. In the following a few examples of practical devices will be presented, each one built from a plurality of the above-described quantum devices.

Figure 10:
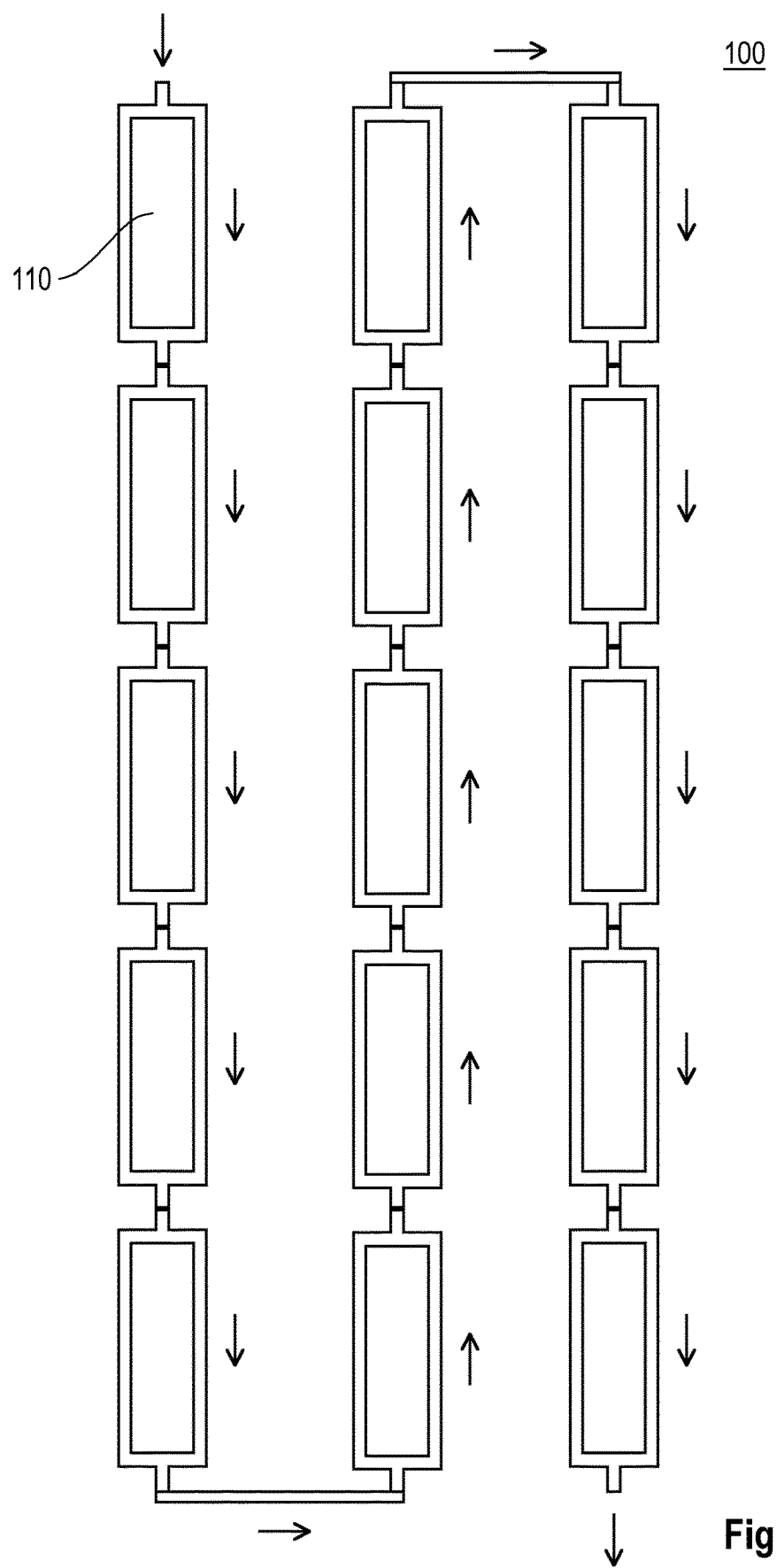
FIG. 10 shows an array of a plurality of quantum devices according to a second aspect in which the devices are connected to each other in series.

FIG. 10 shows an example of an array 100 of quantum devices in which a plurality of quantum devices 110 are electrically connected with each other in series. In the depicted example the chain of serially connected quantum devices 110 comprises the form of a meander in order to optimally occupy the available space on a device surface. The quantum devices 110 can be identical with each other and can be fabricated by usual and well-known fabrication techniques. In each one of the quantum devices 110 an electric current will flow in a self-acting manner as was described above so that the total current flowing through the device corresponds to a single current flowing through one of the quantum devices 110 multiplied by the total number of quantum devices 110. Keeping in mind that the path length l of one quantum device is typically on the order of 100 nm or less and assuming a device edge length of, for example, 1 cm, the total number of serially connected quantum devices could be in the order of $10^{10}$ or even more than that. It should further be mentioned that quantum coherence is only required within each one of the quantum devices 110 and not for several serially connected quantum devices or even the whole chain of serially connected quantum device.

Figure 11A:
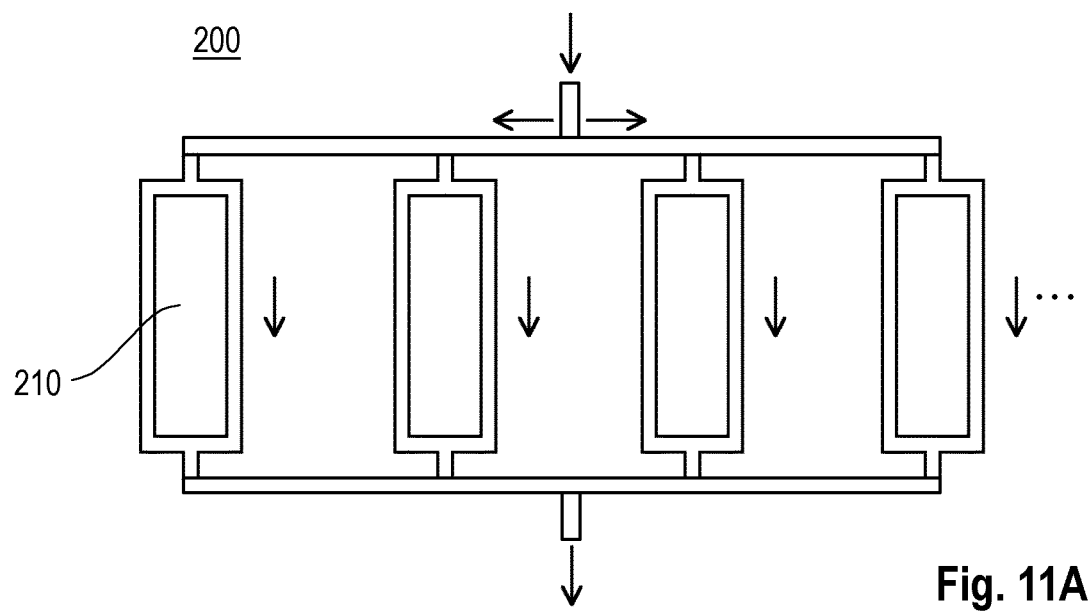
FIG. 11 comprises FIGS. 11A and 11B and shows an array of a plurality of quantum devices according to the second aspect in which the devices are connected to each other in parallel (FIG. 11A), and both in series and in parallel (FIG. 11B).
Figure 11B:
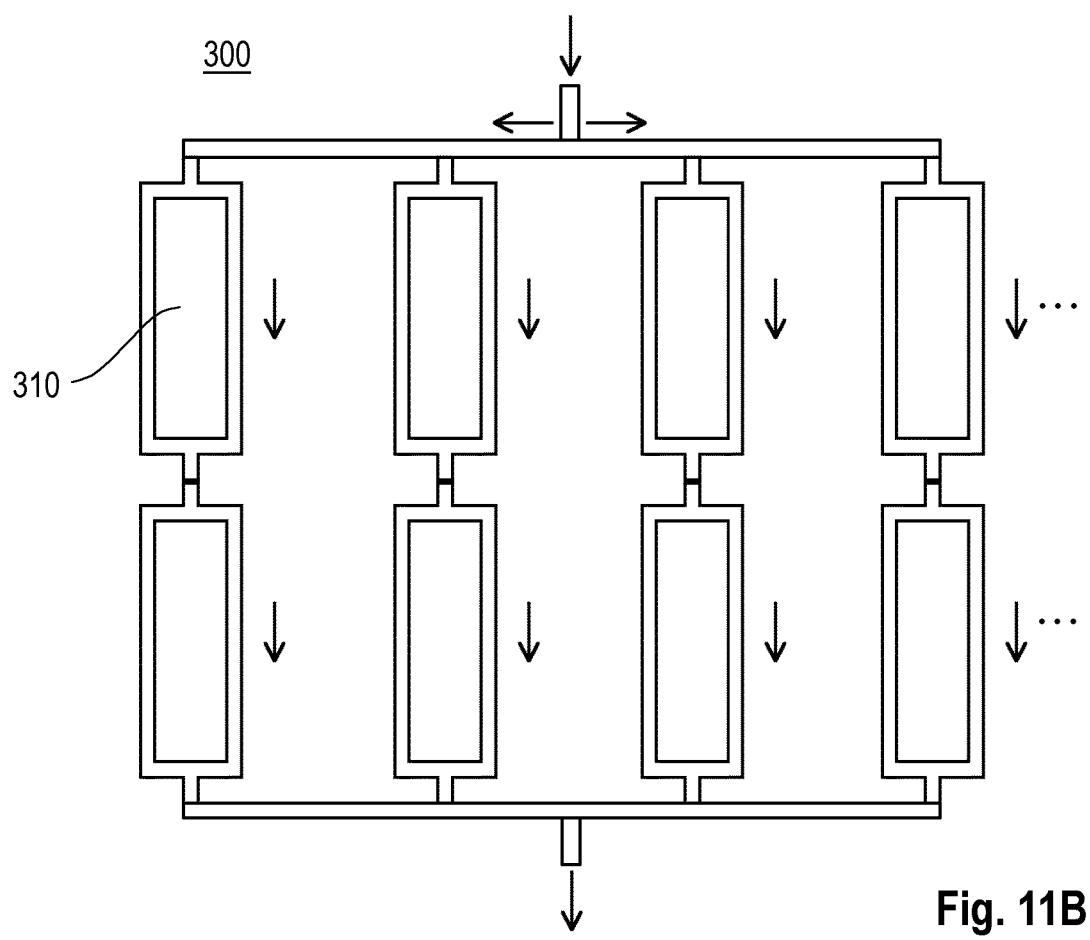

FIG. 11 comprises FIGS. 11A and 11B and shows two further examples of electrically interconnecting the quantum devices.

FIG. 11A shows a device 200 in which a plurality of quantum devices 210 are electrically connected with each other in parallel.

FIG. 11B shows a device 300 in which a plurality of quantum devices 310 are electrically connected with each other in parallel as well as serially.

In the following two simple examples are illustrated in order to show in which way electric power could be generated with the quantum device or with an array of quantum devices.

Figure 12A:
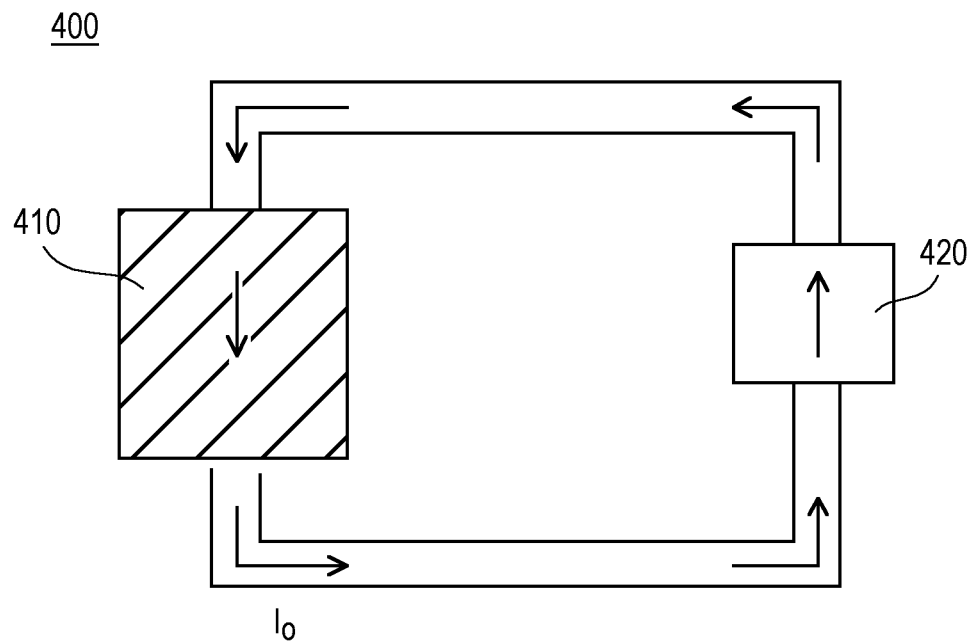
FIG. 12 comprises FIGS. 12A and 12B and illustrates a use of the quantum device or an array of a plurality of quantum devices according to a third aspect of the disclosure in which a closed electrical circuit is built for generating electric current (FIG. 12A), and a stationary voltage is generated that can be tapped and thereafter used for different purposes, e.g., for charging a capacitor (FIG. 12B).
Figure 12B:
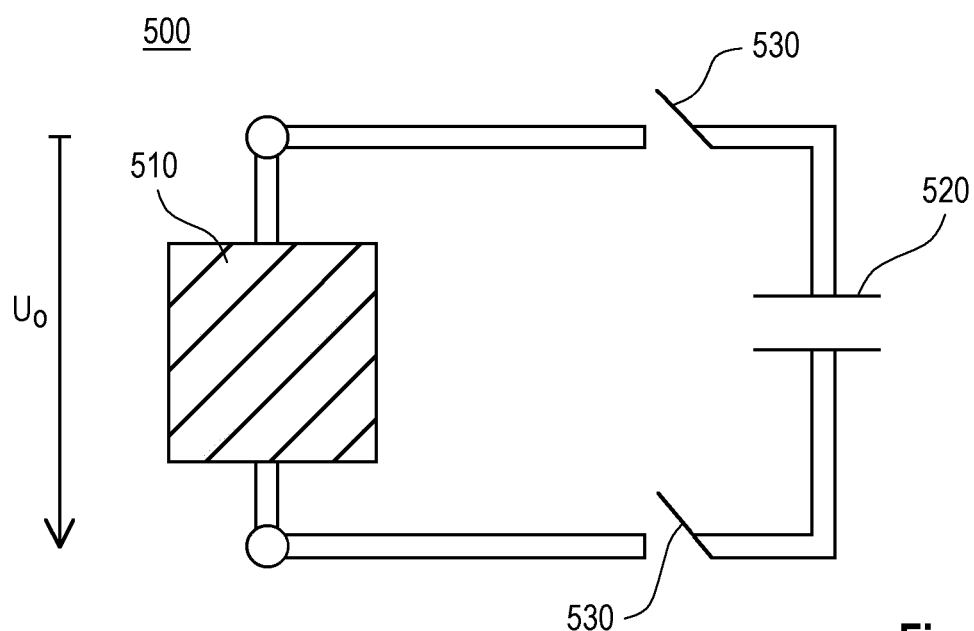

FIG. 12 comprises FIGS. 12A and 12B. FIG. 12A depicts an electrical circuit 400 comprising a current generator 410 that, in principle, can be a single quantum device as described above in one of FIGS. 1 to 9 and practically will be an array of quantum devices as, for example, described above in FIG. 10 or 11. The electrical circuit 400 further comprises a load 420 that can be, for example, a lamp. The current generator 410 generates a current $I_0$ that flows through the electrical circuit 400 in a self-acting manner and thereby feeds the load 420.

FIG. 12B shows another example of an electrical circuit 500 that is configured to utilize the electrical voltage built up by a voltage generator 510. The voltage generator 510 can in principle be one of the quantum devices 10 to 60 as described in FIG. 1 or 9 and practically will be an array 100 to 300 of quantum devices as described above in FIG. 10 or 11. The electrical circuit 500 may further comprise a capacitor 520 that is to be charged up. The electrical circuit 500 may further comprise two switches 530 that may periodically be opened and closed in order to periodically connect the voltage generator 510 with the capacitor 520. The self-acting current flow through the voltage generator 510 leads to the build-up of a voltage $U_0$, which is expected to saturate after a while. The switches 530 may then be closed in order to transfer the built-up charges to the capacitor 520. Thereafter the switches 530 are opened again so that voltage build-up may start again. These actions may be repeated for several times until the capacitance limit of the capacitor 520 is reached. Alternatively it is also possible to omit the switches 530 and to load up the capacitor 520 in a single run. The built-up voltage of the voltage generator 510 could of course also be used for other purposes.

It is furthermore noted that due to their directional conduction properties, the quantum devices according to the first aspect are well suited as devices or device components in signal and data processing such as quantum computing. They permit, for example, to channel signals from an input channel to a device, while isolating the input from unwanted feedback from the output, which is a key requirement for amplification devices and logic gates.

It should further be mentioned that the above-described quantum devices and electrical circuits can only function in a surrounding medium having a temperature $T>0$ K. Such a medium can be solid, liquid or gaseous and forms a heat bath for the quantum devices. The quantum devices extract heat energy from the heat bath and convert the heat energy into the asymmetric current flow as was described above. The particles are moving due to their thermal excitation. The quantum devices would not work at $T=0$ as in this case the law of energy conservation would be violated. But it should also be mentioned that the device can be operated at a lower temperature or at the same temperature than that of the surroundings.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure that performs the specified function of the described component (e.g., that is functionally equivalent), even though not structurally equivalent to the disclosed structure that performs the function in the herein-illustrated exemplary implementations of the invention.

The invention claimed is:

1. A quantum device, comprising:
   a first terminal and a second terminal; and
   a non-reciprocal transmission structure connected between the first and second terminals and configured to transmit microscopic particles in at least a partially phase-coherent manner from the first terminal to the second terminal and possibly from the second terminal to the first terminal;
   wherein a time-reversal symmetry of the transmission of the microscopic particles is broken with respect to at least a portion of the transmission structure; and
   wherein the time-reversal symmetry is broken in such a way that the transmission structure is configured to provide an asymmetric current flow comprising a higher transmission probability for particles moving in a first direction from the first terminal to the second terminal than in a second direction from the second terminal to the first terminal; and
   wherein the quantum device extracts heat energy from a surrounding heat bath and converts the heat energy into movement of the microscopic particles such that the quantum device converts the heat energy into the asymmetric current flow.

2. The quantum device according to claim 1, wherein the higher transmission probability is present without an external application of a voltage or a current to one or both of the first and second terminals.

3. The quantum device according to claim 1, wherein:
   the transmission structure comprises at least two transmission paths; and
   a particle associated with a particle wave emanates from one of the first and second terminals and is split up into partial waves propagating on the at least two transmission paths in the first and second directions, respectively;
   wherein first partial waves propagating in the first direction converge and interfere with each other at the second terminal and second partial waves propagating in the second direction converge and interfere with each other at the first terminal, wherein the first partial waves interfere more constructively than the second partial waves.

4. The quantum device according to claim 1, further comprising:
   a magnetic field comprising a component perpendicular to a first transmission path and a second transmission path; and
   an electric field comprising a component perpendicular to at least a portion of one of the transmission paths and perpendicular to the component of the magnetic field.

5. The quantum device according to claim 1, wherein the transmission structure comprises at least one transmission path comprising a tunnel barrier.

6. An array of two or more quantum devices according to claim 1, wherein the quantum devices are connected to each other in series and/or in parallel or antiparallel.

7. Use of the quantum device according to claim 1 for either one of:
   generating electric power in a form of one or more of electric current or electric voltage;
   filtering particles according to their group velocity;
   filtering particles according to their transmission directions;
   filtering particles according to their spin direction; or
   filtering particles according to their valley occupancy.

8. Use of the quantum device according to claim 7, wherein the quantum device is operated at a lower temperature or at a same temperature than that of its surroundings.

9. The quantum device according to claim 1, further comprising:
   a first transmission path connected between the first and second terminals; and
   a second transmission path connected between the first and second terminals;
   wherein the time-reversal symmetry of the transmission of the microscopic particles is broken in the first transmission path.

10. The quantum device according to claim 9, further comprising a length of the first and second transmission paths being chosen such that selective phase-coherent particle transmission is ensured.

11. The quantum device according to claim 9, wherein:
    a particle associated with a particle wave emanates from one of the first and second terminals and is split up into partial waves propagating on the first and second transmission paths in the first and second directions, respectively; and first partial waves propagating in the first direction are affected by an underlying material or an applied magnetic field in a different manner than the second partial waves propagating in the second direction.

12. The quantum device according to claim 9, further comprising:
the microscopic particles each comprising a spin associated with a magnetic moment, wherein magnetic moments of particles in the first transmission path are aligned;
an electric field comprising a component oriented perpendicular to a direction of the magnetic moments and perpendicular to a direction of transmission of microscopic particles in the first transmission path;
the first transmission path comprising a first material, the first material comprising a first spin-orbit coupling strength cu and a first particle group velocity $v_1$; and
the second transmission path comprising a second material, the second material comprising a second spin-orbit coupling strength $\alpha_2$ different from the first spin-orbit coupling strength $\alpha_1$ and a second particle group velocity $v_2$ different from the first particle group velocity $v_2$.

13. The quantum device according to claim 12, further comprising values of $\alpha_1$, $\alpha_2$, $v_1$ and $v_2$ being chosen such that the first partial waves interfere more constructively than the second partial waves.

14. The quantum device according to claim 12, further comprising a magnetic field applied in order to align the magnetic moments of particles in the first material of the first transmission path.

15. The quantum device according to claim 14, wherein the magnetic field comprises a component being oriented perpendicular to the direction of the transmission of the microscopic particles and perpendicular to the direction of the electric field.

16. The quantum device according to claim 12, wherein the electric field is generated in the first material of the first transmission path.

17. The quantum device according to claim 16, wherein the microscopic particles are comprised of any one of electrons, neutrons, protons, atoms, photons, or ions.

* * * * *

UNITED STATES PATENT AND TRADEMARK OFFICE
CERTIFICATE OF CORRECTION

| | |
|---|---|
| PATENT NO. | : 11,342,645 B2 |
| APPLICATION NO. | : 16/976848 |
| DATED | : May 24, 2022 |
| INVENTOR(S) | : Jochen Mannhart |

It is certified that error appears in the above-identified patent and that said Letters Patent is hereby corrected as shown below:

In the Claims

Claim 12,     Column 15,     Line 16,     change "cu" to -- $\alpha_1$ --

Signed and Sealed this
Twenty-eighth Day of February, 2023

Katherine Kelly Vidal
*Director of the United States Patent and Trademark Office*